United States Patent [19]
Lee

[11] Patent Number: 5,904,535
[45] Date of Patent: May 18, 1999

[54] METHOD OF FABRICATING A BIPOLAR INTEGRATED STRUCTURE

[75] Inventor: Steven S. Lee, Colorado Springs, Colo.

[73] Assignee: Hyundai Electronics America, San Jose, Calif.

[21] Appl. No.: 08/748,969

[22] Filed: Nov. 13, 1996

Related U.S. Application Data

[63] Continuation of application No. 08/657,060, May 28, 1996, abandoned, which is a continuation of application No. 08/460,302, Jun. 2, 1995, abandoned.

[51] Int. Cl.$^6$ .................................................. H01L 21/331
[52] U.S. Cl. ...................... 438/341; 438/355; 438/360; 438/423; 438/234
[58] Field of Search .................................. 438/341, 355, 438/360, 361, 423, 429, 234

[56] References Cited

U.S. PATENT DOCUMENTS

| | | | |
|---|---|---|---|
| 4,700,461 | 10/1987 | Choi et al. | 437/41 |
| 4,839,309 | 7/1989 | Easter et al. | 437/160 |
| 4,965,872 | 10/1990 | Vasudev | 357/35 |
| 5,028,557 | 7/1991 | Tsai et al. | 437/59 |
| 5,049,513 | 9/1991 | Eklund | 437/34 |
| 5,057,580 | 10/1991 | Fock et al. | 525/329.5 |
| 5,060,035 | 10/1991 | Nishimura et al. | 357/23.7 |
| 5,073,506 | 12/1991 | Maszara et al. | 437/21 |
| 5,075,241 | 12/1991 | Spratt et al. | 437/31 |
| 5,100,810 | 3/1992 | Yoshimi et al. | 437/21 |
| 5,102,809 | 4/1992 | Eklund et al. | 437/21 |
| 5,140,390 | 8/1992 | Li et al. | 357/23.7 |
| 5,162,882 | 11/1992 | Pollack | 257/349 |
| 5,212,397 | 5/1993 | See et al. | 257/347 |
| 5,236,863 | 8/1993 | Iranmanesh | 437/89 |
| 5,250,461 | 10/1993 | Sparks | 437/90 |
| 5,273,915 | 12/1993 | Hwang et al. | 437/34 |
| 5,289,027 | 2/1994 | Terrill et al. | 257/327 |
| 5,308,785 | 5/1994 | Comfort et al. | 437/90 |
| 5,422,299 | 6/1995 | Newdeck et al. | 437/90 |
| 5,434,092 | 7/1995 | Neudeck et al. | 437/89 |

*Primary Examiner*—Tuan H. Nguyen
*Attorney, Agent, or Firm*—Townsend and Townsend and Crew LLP

[57] ABSTRACT

A process for fabricating a bipolar transistor on a silicon-on-insulator substrate which includes etching a bipolar transistor area into the substrate, wherein the bipolar transistor area has substantially vertical sidewalls and a bottom, and forming a buried collector in bottom of the bipolar transistor area. Polysilicon sidewalls are formed adjacent to the vertical sidewalls in the bipolar transistor area, wherein the polysilicon sidewalls are connected to the buried collector. The polysilicon sidewalls are oxidized to form a layer of oxidized polysilicon. Oxide sidewalls are formed on the oxidized polysilicon sidewalls, and epitaxial silicon is formed to fill the bipolar transistor area. A base and an emitter are formed for the bipolar transistor, within the epitaxial barrier.

25 Claims, 8 Drawing Sheets

METHOD OF FABRICATING A BIPOLAR INTEGRATED STRUCTURE

This is a continuation of prior application Ser. No. 08/657,060 filed on May 28, 1996, which is a continuation of prior application Ser. No. 08/460,302 filed Jun. 2, 1995 now abandoned.

BACKGROUND OF THE INVENTION

1. Technical Field

The present invention is generally related to integrated circuits and in particular to a process of forming a bipolar transistor structure in an integrated circuit. Still more particularly, the present invention is related to a process for forming a bipolar transistor structure that is compatible for forming CMOS structures using silicon-on-insulator technology.

2. Description of the Related Art

The integration of metal oxide-semiconductor field effect (MOSFET) structures and bipolar transistors on a single substrate has become very desirable. In addition, silicon-on-insulator (SOI) technology is attractive for high speed complementary metal oxide-semiconductor (CMOS) and radiation hardened devices. SOI technology offers the highest performance for a given feature size due to the minimization of parasitic compacitance. In SOI technology, small islands of silicon which contain the individual device are fabricated on an insulating substrate. These islands are then interconnected in the normal way.

As is well known in the art, digital and linear functions are often performed by integrated circuits using either bipolar or metal-oxide-semiconductor (MOS) technology. Bipolar integrated circuits, of course, generally provide higher speed operation and greater drive currents then the MOS circuits. Recent advances in manufacturing technology have allowed the use of both bipolar and CMOS transistors in the same integrated circuit (commonly referred to as BiCMOS devices). Several merged BiCMOS processes make use of the inherent vertical NPN transistor present in a bulk CMOS process. In a SOI CMOS, such vertical structures do not exist and lateral bipolar transistors may be suitable for sharing fabrication steps with MOSFET's. Unfortunately, lateral bipolar transistors suffer from an inherent performance limitation related to their large base width and the base series resistance. As a result, it would be advantageous to have a process for manufacturing a vertical bipolar transistor with a SOI MOS transistor.

SUMMARY OF THE INVENTION

It is one object of the present invention to provide an improved integrated circuit.

It is another object of the present invention to provide an improved process for forming a bipolar structure in an integrated circuit.

It is yet another object of the present invention to provide an improved process for forming a bipolar transistor structure for use in silicon-on-insulator technology.

The present invention provides a bipolar transistor on a silicon-on-insulator substrate. A buried collector is located in a trench formed in the substrate. Polysilicon sidewalls are formed at the sides of the trench, and connected to the buried collector. Then, oxide sidewalls are formed against the oxidized polysilicon sidewalls to separate them from the interior of the trench. Epitaxial silicon fills the trench between the sidewalls. The bipolar transistor has a base and an emitter formed in the epitaxial silicon, wherein the polysilicon sidewalls form a collector connection to the buried collector.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

The present invention is illustrated on a silicon-on-insulator (SOI) substrate. Starting SOI materials are made using zone melting recrystalization (ZMR) or separation by implanted oxygen (SIMOX).

Figure 1:
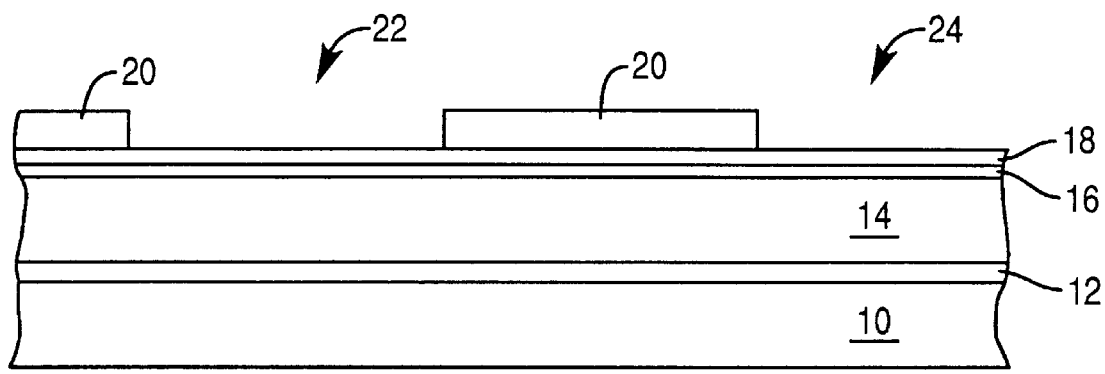
FIGS. 1–15 illustrate a vertical cross-sectional representation of a process for forming a bipolar transistor on a silicon-on-insulator substrate in accordance with a preferred embodiment of the present invention.

In FIG. 1, substrate 10 is a silicon substrate. A method to form SOI structures involves implanting oxygen into a substrate 10 and annealing the substrate at high temperatures known to those skilled in the art afterward to remove the defects from oxygen implantation and to form a dielectric layer 12. Dielectric layer 12 is from about 100 nm to about 2,000 nm thick. A thin pad oxide layer 16 is deposited over silicon layer 14. Preferably, silicon layer 14 is from about 200 nm to about 500 nm thick. Pad oxide layer 16 is from about 0 nm to about 200 nm thick. Preferably, pad oxide layer 16 should be from about 20 nm to about 50 nm thick. A silicon nitride ($Si_3N_4$) layer 18 is deposited on pad oxide layer 16 having a thickness from about 5 nm to about 300 nm. Preferably, nitride layer 18 is from about 150 nm to about 250 nm thick. Nitride layer 18 is employed as an oxidation barrier, and pad oxide layer 16 is used as a buffer between nitride layer 18 and the silicon layer 14.

A masking layer 20 covers nitride layer 18. Masking layer 20 is a layer of photoresist in accordance with a preferred embodiment of the present invention. Windows 22 and 24 are opened in mask layer 20, where these windows serve to define the bipolar regions and isolation areas. MOS is build upon silicon layer 14 above dielectric layer 12 (SOI).

Figure 2:
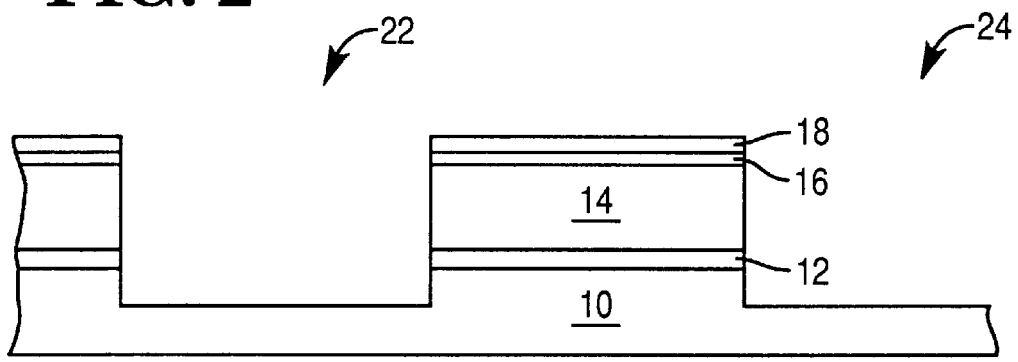

In FIG. 2, the structure of FIG. 1 is etched to remove a selected amount of material exposed by windows 22 and 24 to create bipolar transistor areas. In particular, this etching results in the formation of a bipolar transistor area. This area also provides for isolation in which the bipolar transistor will be formed. The bipolar transistor areas within windows 22 and 24 are etched to a depth from about 1,000 nm to about 3,000 nm.

Figure 3:
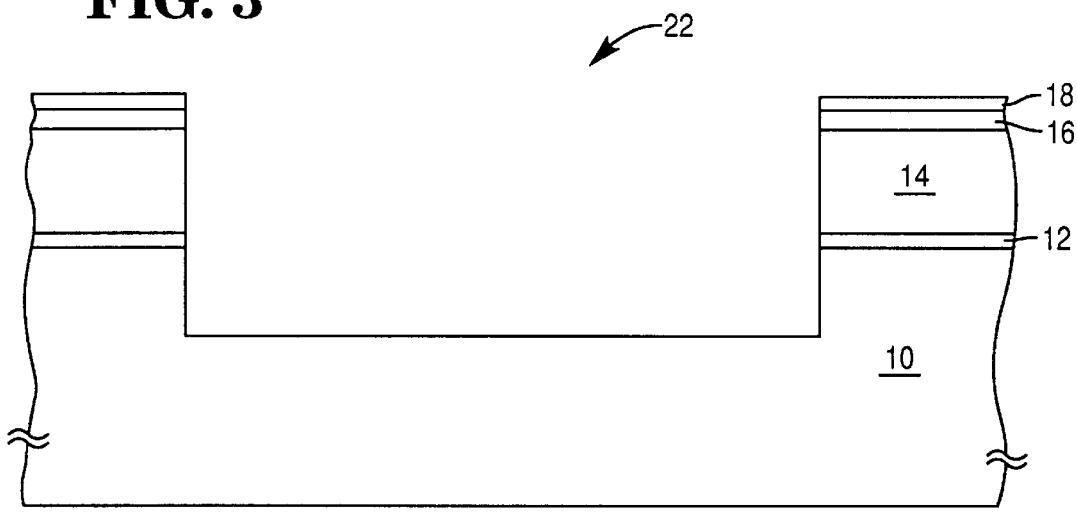
Figure 4:
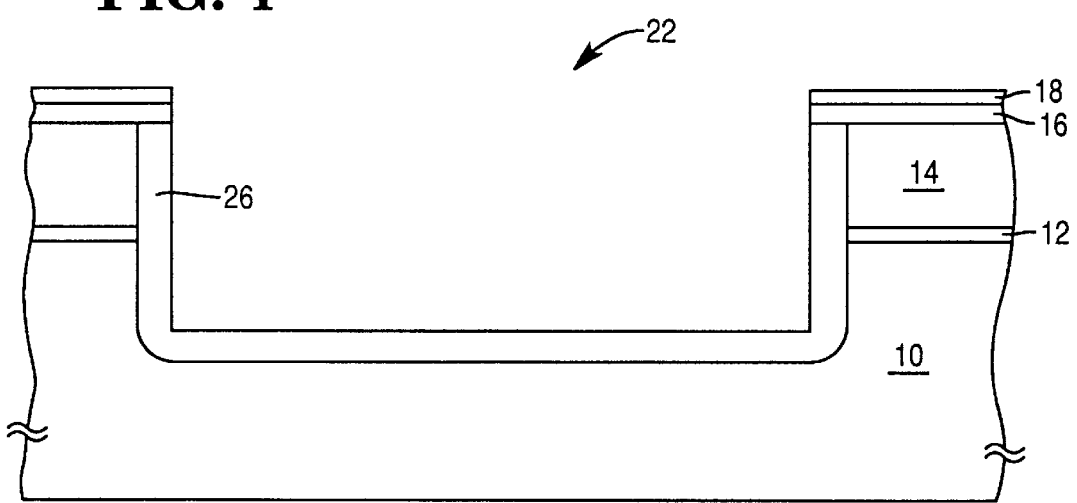
Figure 5:
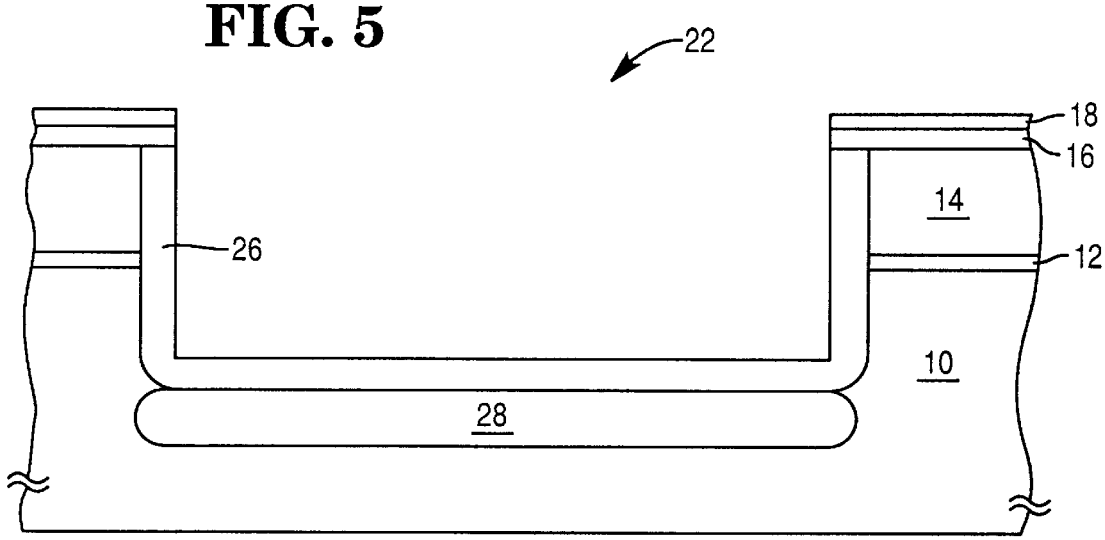

With reference to FIG. 3, an enlarged view of the bipolar transistor area defined by window 22 is depicted. As shown in FIG. 5, a thermal oxide layer 26 is grown within the bipolar transistor area defined by window 22. Thermal oxide layer 26 is grown from about 30 nm to about 200 nm thick. Next, as shown in FIG. 5, a buried layer 28 is implanted into substrate 10. Buried layer 28 is formed using a low-angle buried layer implant. The implant is a N+ for NPN bipolar transistor or P+ and N+, in different regions, for complementary PNP and NPN bipolar transistors. Buried layer 28 has a concentration from about $10^{18}$ cm$^{-3}$ to about $10^{22}$ cm$^{-3}$.

Figure 6:
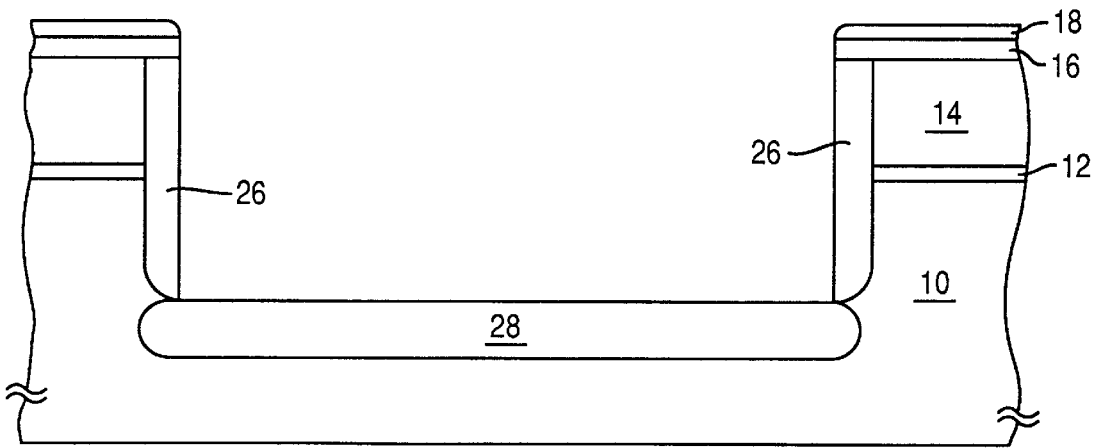
Figure 7:
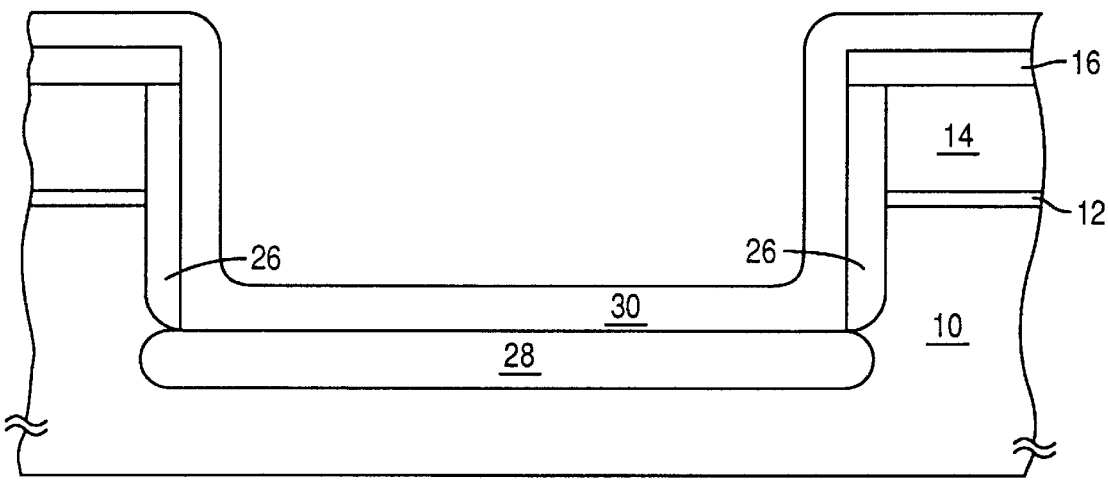

As shown in FIG. 6, a reactive ion etch (RIE) is used to remove the portion of thermal oxide layer 26 at the bottom of the bipolar/isolation area defined by window 22. The remaining portions of oxide layer 26 form oxide sidewalls. In FIG. 7, nitride layer 18 has been removed using a wet etch. A polysilicon layer 30 is then deposited on the structure. Polysilicon layer 30 will form part of the collector in the bipolar transistor. Polysilicon layer 30 may be highly doped to increase its conductivity using poly diffusion. Alternatively, an in-situ doped poly deposition process may be employed. Polysilicon layer 30 is from about 50 nm to about 600 nm thick and preferably is from about 200 nm to about 400 nm thick.

Figure 8:
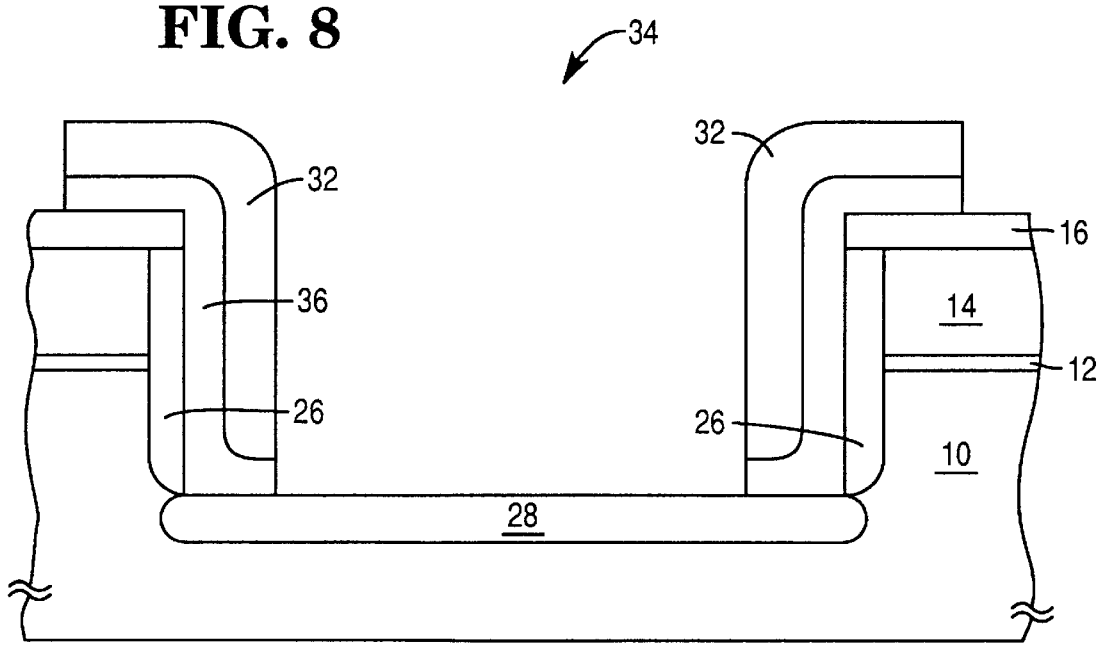
Figure 9:
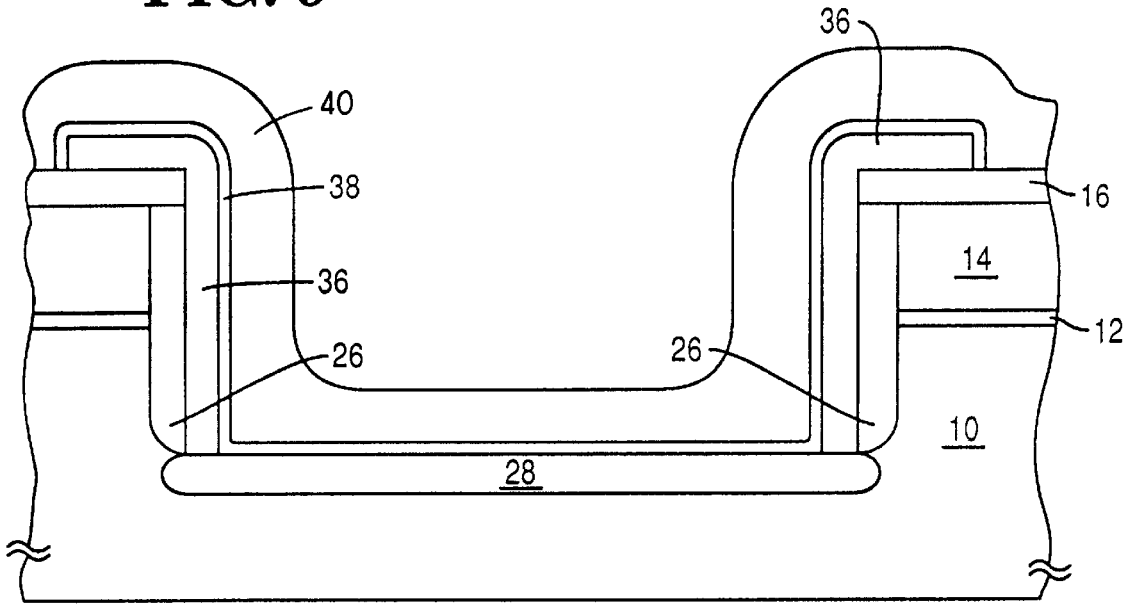

With reference to FIG. 8, a masking layer 32 is placed over the structure and window 34 is opened in masking layer 32 and polysilicon layer 30 is etched to define collector connections 36 for the bipolar transistor. Alternately, a self-aligned poly etch may be employed to define collector connections 36. In the latter case, polysilicon layer 30 will remain only on the sidewalls. Next in FIG. 9, oxidation of the collector connection 36 is performed to oxidize a portion of the polysilicon in collector connection 36 to form thermal oxide layer 38. This thermal oxide layer is from about 10 nm to about 100 nm thick and is preferably from about 20 nm to about 50 nm thick. Next, chemical vapor deposition (CVD) is used to deposit oxide layer 40 onto the structure as shown in FIG. 9. Oxide layer 40 may be from about 30 nm to about 400 nm thick, but is preferably from about 100 nm to about 200 nm thick.

Figure 10:
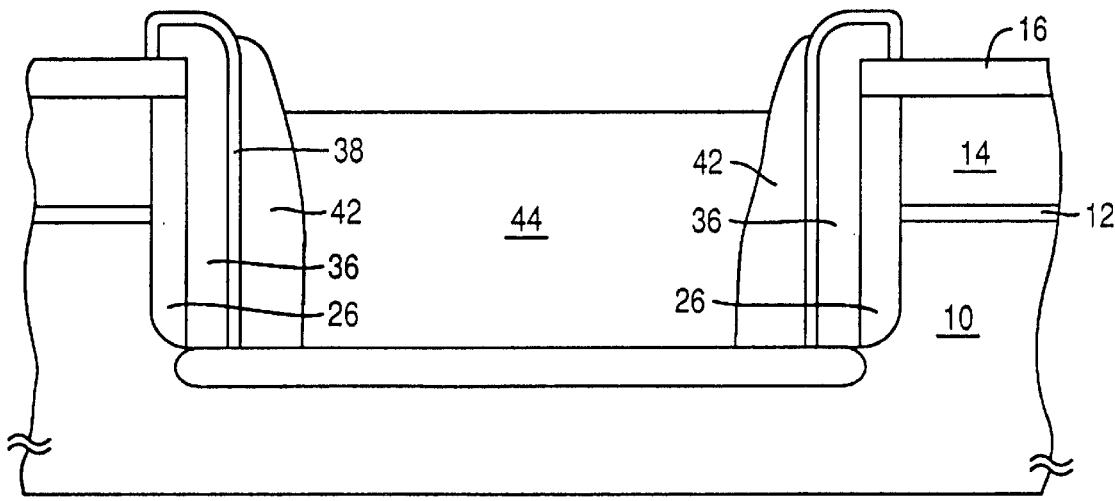

Thereafter, a RIE process is performed on the device to form oxide sidewalls 42 from oxide layer 40. An anneal step is added afterward to remove etch damages. Then, a selective epitaxial silicon growth process is used to form epitaxial layer 44 as illustrated in FIG. 10.

Figure 11:
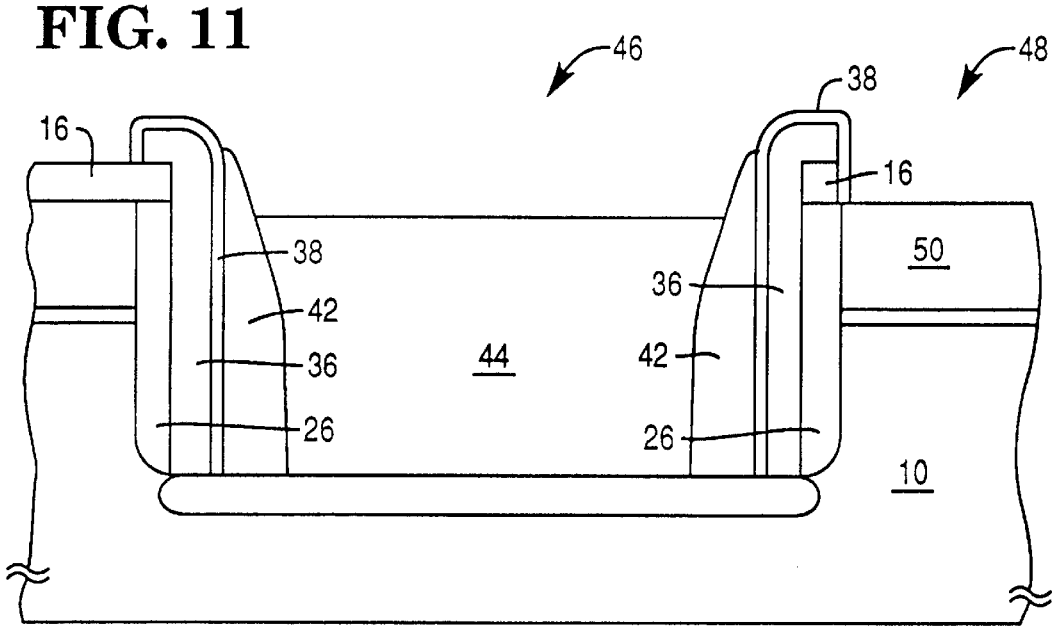

FIGS. 11–14 illustrate one example of the formation of both a bipolar transistor 46 and field effect device, such as, MOSFET 48. In the depicted example, bipolar transistor 46 is an NPN transistor. Well/collector formation for an NPN collector includes masking the device and implanting phosphorous to create both an N well and a N collector. In FIG. 11, the implantation of phosphorous is performed from about 80 keV to about 150 keV at a concentration from about 4 E12 cm$^{-3}$ to about 12 E12 cm$^{-3}$. Typically, the implant is performed at about 125 keV at a concentration of about 8 E12 cm$^{-3}$. For a PNP transistor, a P collector can be formed at the same time as a P well using boron implantation. With a PNP transistor, boron is implanted in accordance with a preferred embodiment of the present invention from about 60 keV to about 120 keV at a concentration from about 6 E12 cm$^{-3}$ to about 15 E12 cm$^{-3}$. Well drive is performed afterward for both well and collector formation. This forms an N well in region 50 in device 48, which will be MOSFET 48.

Figure 12:
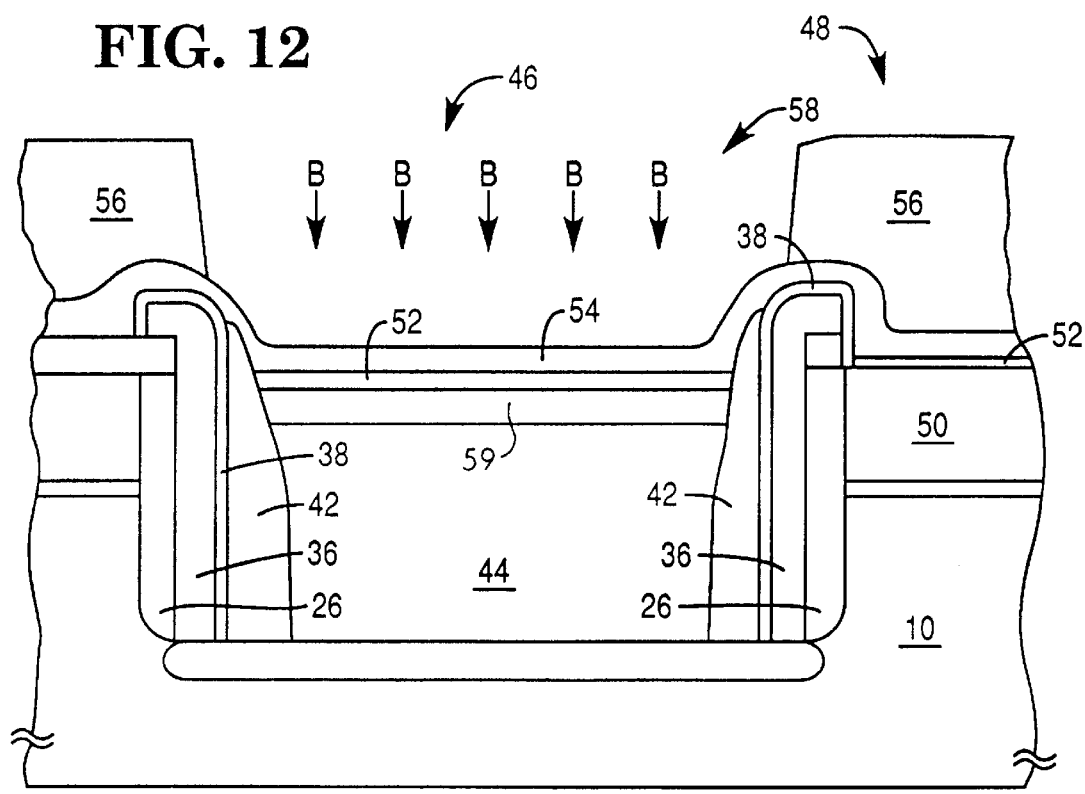

In FIG. 12, gate oxide layer 52 is grown over epitaxial layer 44 and substrate layer 14 in regions 50 to a thickness from about 50 A to about 200 A. Preferably, gate oxide layer 52 is from about 90 A to about 150 A. A poly layer 54 is then deposited over gate oxide layer 52 having a thickness from about 300 A to about 1,000 A. Preferably, poly layer 54 is about 500 A thick. Thereafter, photoresist layer 56 is placed over the device and an opening 58 is created for implantation of boron. Boron is implanted at a concentration from about 1 E13 cm$^{-3}$ to about 8 E13 cm$^{-3}$ at about 10 keV to about 90 keV to create an intrinsic base region 59. Typically, boron is implanted at a concentration of 2 E13 cm$^{-3}$ at about 30 keV.

Figure 13:
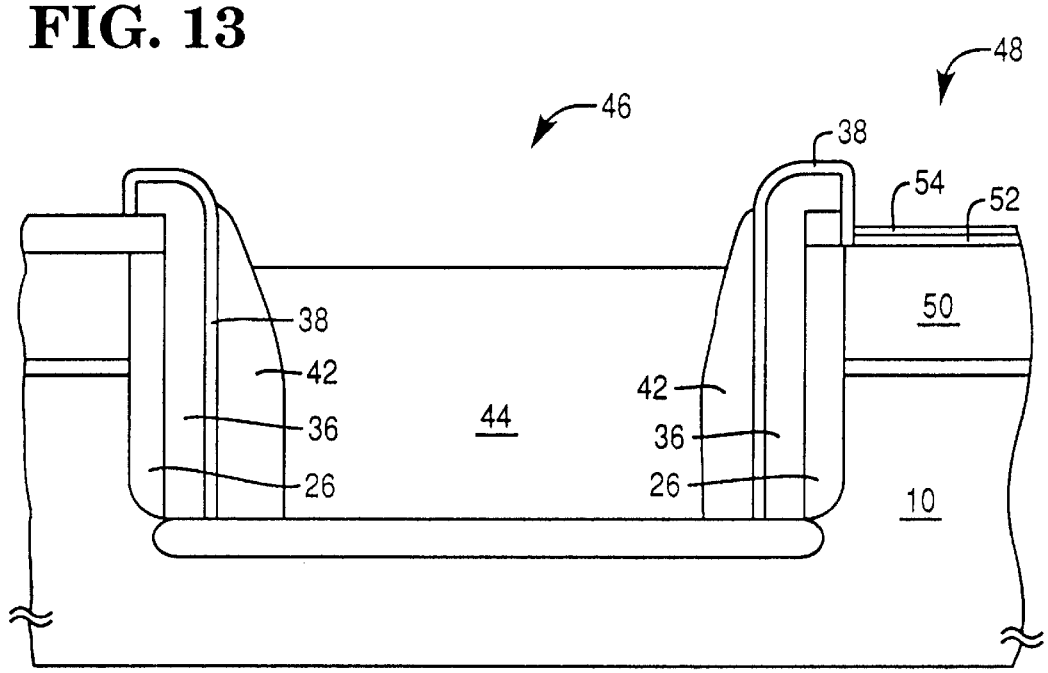

Thereafter, a reactive ion etch is performed to remove the poly layer 54 and gate oxide layer 52 from the bipolar areas. As shown in FIG. 13 portions of gate oxide layer 52 poly layer 54 remain, part of which will become a part of a gate for MOSFET 48.

Figure 14:
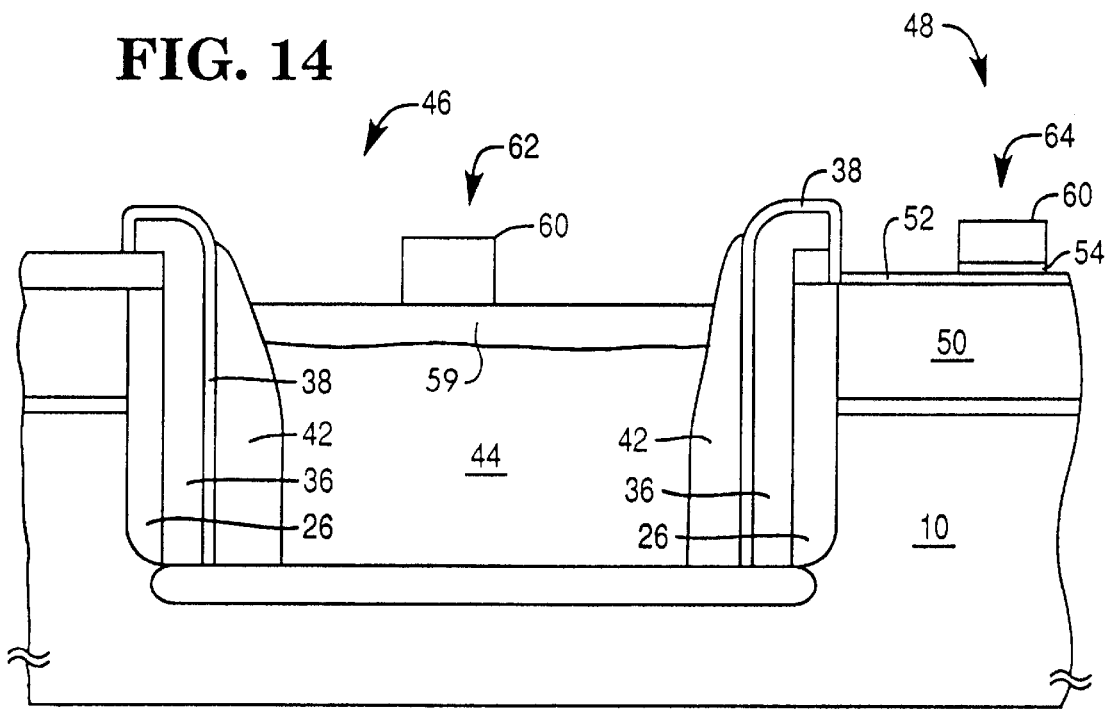

A poly layer 60 is deposited and the device is masked and etched to form parts of the collector and gate for bipolar transistor 46 and MOSFET 48, respectively. Next, the poly is doped with POCl$_3$ or PH$_3$ to a concentration greater than 1 E22 cm$^{-3}$. The devices are masked and an RIE etch is performed to create emitter 62 and gate 64, as shown in FIG. 14. Then, NLDD is performed using phosphorous. A mask and LDD implant is performed to create an NMOS and a PNP device. For a PMOS and NPN device, a PLDD is performed using a mask and LDD implant with boron.

Figure 15:
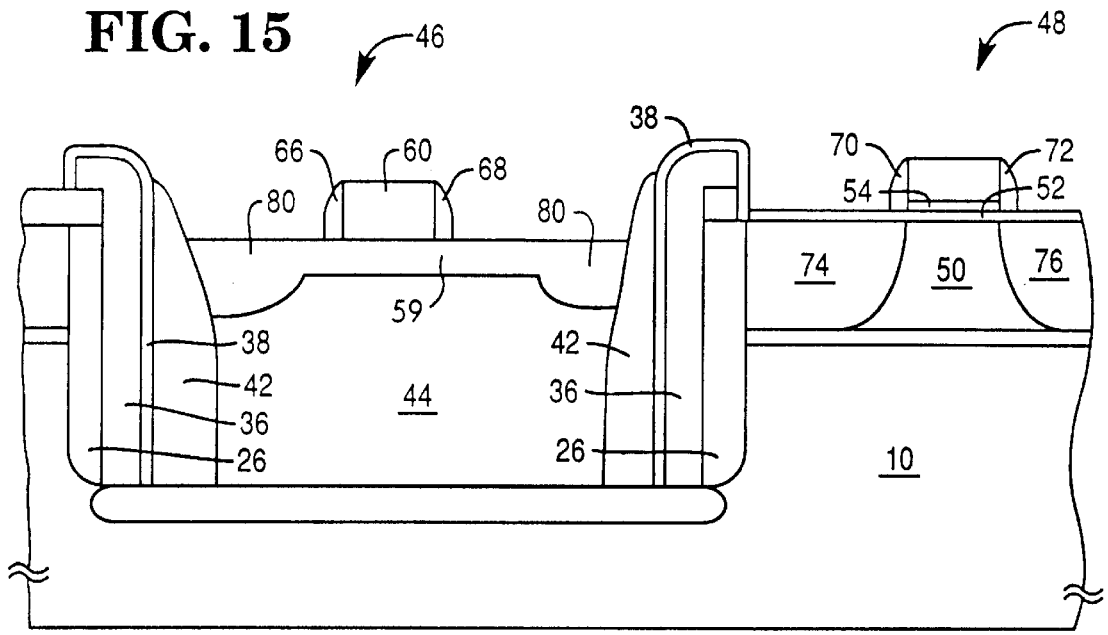

Next in FIG. 15, spacers 66, 68, 70, and 72; source 74 and drain 76, and extrinsic base 80 are formed. Spacers 66, 68, 70, and 72, source 74, drain 76, and extrinsic base 80 are formed using processes known to those skilled in the art.

Figure 16:
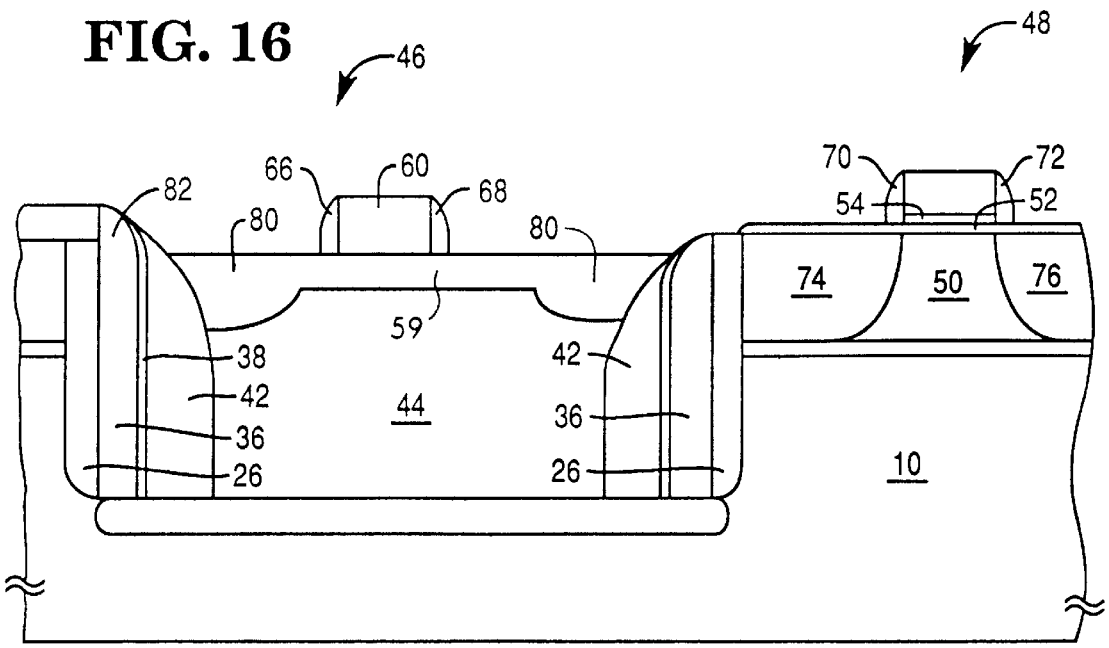
FIG. 16 illustrates a vertical cross-sectional representation of a preferred embodiment of the present invention.

As can be seen in FIG. 15, bipolar transistor 46 has collector connection 36. FIG. 16 depicts an alternative embodiment for bipolar transistor 46 in which collector connection 82 has a different structure then in FIG. 14. In both embodiments, the extrinsic collector connection replaces the typical deep collector implant.

As can be seen in the figures, the oxide sidewalls between the polysilicon and the epitaxial silicon form an insulator to provide isolation between the collector connection and the base of the bipolar transistor.

The bipolar transistor of the present invention provides a low collector sheet bulk resistivity. A polysilicon emitter is provided using the bipolar transistor of the present invention. Furthermore, this bipolar transistor provides a polysilicon strip that replaces the typical deep collector implant and uses the sidewall oxide for isolation. As a result, using the process of the present invention to create the bipolar transistor, latch up resistance is improved, ESD producation is provided, and radiation hardness is enhanced.

While the invention has been particularly shown and described with reference to a preferred embodiment, it will be understood by those skilled in the art that various changes in form and detail may be made therein without departing from the spirit and scope of the invention.

I claim:

1. A method of fabricating an integrated circuit element on a silicon-on-insulator substrate comprising:

etching a bipolar transistor area into the substrate through an upper silicon layer and an insulator layer into a lower silicon layer, wherein the bipolar transistor area has substantially vertical walls and a bottom;

forming a buried collector in the bottom of the bipolar transistor area;

forming conductive polysilicon sidewalls adjacent to the vertical walls in the bipolar transistor area, wherein the conductive polysilicon sidewalls are connected to the buried collector;

oxidizing a portion of the conductive polysilicon sidewalls to form a layer of oxidized polysilicon on the conductive polysilicon sidewalls;

forming oxide sidewalls on a vertical portion of the layer of oxidized polysilicon;

forming epitaxial silicon to fill the bipolar transistor area;

forming a base for the bipolar transistor within the epitaxial silicon; and forming an emitter for the bipolar transistor within the epitaxial silicon, wherein the conductive polysilicon sidewalls form a collector connection to the buried collector in the bipolar transistor area.

2. The method of claim 1, wherein the step of etching a bipolar transistor area comprises etching a bipolar transistor area into the substrate to a depth from about 100 nm to about 3000 nm.

3. The method of claim 1, wherein the step of forming a buried collector comprises forming a buried collector in the bottom of the bipolar transistor area, wherein the buried collector has a dopant concentration from about $10^{18}$ cm$^{-3}$ to about $10^{22}$ cm$^{-3}$.

4. The method of claim 1, wherein the step of forming a buried collector comprises using a buried layer implant with N+ dopants.

5. The method of claim 1, wherein the step of forming polysilicon sidewalls comprises forming polysilicon sidewalls adjacent to the vertical walls in the bipolar transistor area, wherein the polysilicon sidewalls are connected to the buried collector and have a thickness from about 50 nm to about 600 nm thick.

6. The method of claim 1, wherein the step of forming polysilicon sidewalls comprises forming conductive polysilicon sidewalls adjacent to the vertical walls in the bipolar transistor area, wherein the conductive polysilicon sidewalls are connected to the buried collector and have a thickness from about 200 nm to about 400 nm thick.

7. The method of claim 1, wherein the step of oxidizing the conductive polysilicon sidewalls, includes oxidizing the conductive polysilicon sidewalls to form a layer of oxidized polysilicon having a thickness from about 10 nm to about 100 nm.

8. The method of claim 1, wherein the step of oxidizing the conductive polysilicon sidewalls, includes oxidizing the conductive polysilicon sidewalls to form a layer of oxidized polysilicon having a thickness from about 20 nm to about 50 nm.

9. The method of claim 1, wherein the step of forming oxide sidewalls includes forming oxide sidewalls having a thickness from about 30 nm to about 400 nm.

10. The method of claim 1, wherein the step of forming oxide sidewalls includes forming oxide sidewalls having a thickness from about 100 nm to about 200 nm.

11. The method of claim 10, wherein the step of forming an intrinsic base region includes implanting boron to create the intrinsic base region.

12. The method of claim 11, wherein the step of implanting boron includes implanting boron from about 10 keV to about 90 keV.

13. The method of claim 1, wherein the step of forming a base includes forming an intrinsic base region.

14. The method of claim 13, wherein the step of implanting boron in a concentration from about 1 E13 cm$^{-3}$ to about 8 E12 cm$^{-3}$.

15. The method of claim 1, further comprising forming a field effect device region within the substrate and forming a field effect device within the field effect device region.

16. A The method of claim 1, wherein the step of forming a buried collector further comprises forming a buried collector below the insulator.

17. The method of claim 1, wherein at least a portion of the substantially vertical walls extend into the lower silicon layer.

18. The method of claim 1, wherein at least an upper portion of the bipolar transistor area is etched through a monocrystalline upper silicon layer and the insulator.

19. The method of claim 1, wherein at least an upper portion of the bipolar transistor area is etched through a silicon layer and an insulator.

20. A method of fabricating a transistor on a substrate comprising;

etching a cavity through a silicon layer and an insulator layer of said substrate, wherein the silicon layer is located on the insulator layer;

forming a buried collector in the bottom of the cavity;

forming first oxide sidewalls in contact with the substantially vertical walls in the cavity;

forming conductive polysilicon sidewalls in contact with the first oxide sidewalls within the cavity, wherein the conductive polysilicon sidewalls are connected to the buried collector;

oxidizing a portion of the conductive polysilicon sidewalls in contact with the substantially vertical sidewalls within the cavity to form a layer of oxidized polysilicon on the conductive polysilicon sidewalls;

forming second oxide sidewalls on a vertical portion of the layer of oxidized polysilicon;

forming epitaxial silicon to fill the cavity;

forming a base for the transistor within the epitaxial silicon; and forming an emitter for the transistor within the epitaxial silicon, wherein the conductive polysilicon sidewalls form a collector connection to the buried collector.

21. The method of claim 20, wherein the step of forming first oxide sidewalls comprises forming thermal oxide sidewalls in contact with the substantially vertical walls in the cavity.

22. The method of claim 20, wherein the step of etching a cavity further comprises etching a cavity into a portion of the substrate.

23. The method of claim 20, wherein the step of forming a buried collector further comprises forming the buried collector below the insulator layer.

24. The method of claim 20, wherein the step of etching a cavity further comprises etching a cavity into a portion of the substrate.

25. A method for fabricating a transistor on a silicon-on-insulator substrate, the silicon-on-insulator substrate having a substrate, an insulator on the substrate, and a silicon layer on the insulator, the method comprising:

etching a cavity through the silicon layer and the insulator into the substrate, wherein the cavity has substantially vertical walls and a bottom;

forming a thermal oxide layer on the substantially vertical walls and the bottom of the cavity;

implanting ions into the substrate under the thermal oxide layer at the bottom of the cavity to form a buried collector;

removing a portion of the thermal oxide layer at the bottom of the cavity to expose a portion of the buried collector, wherein a remaining portion of the thermal oxide layer forms first oxide sidewalls;

depositing a layer of conductive polysilicon within the cavity, wherein the conductive polysilicon layer covers the first oxide sidewalls and the exposed portion of the buried collector;

removing a portion of the conductive polysilicon layer to expose a portion of the buried collector, wherein the remaining portions of the conductive polysilicon layer form conductive polysilicon sidewalls located adjacent to the first oxide sidewalls and the conductive polysilicon sidewalls form a collector connection to the buried collector in the cavity;

oxidizing a portion of the conductive polysilicon sidewalls to form thermal oxide sidewalls;

depositing an oxide layer into the cavity and etching the oxide layer to form second oxide sidewalls in contact with the thermal oxide sidewalls;

forming epitaxial silicon to fill the cavity;

forming a base for the transistor within the epitaxial silicon; and forming an emitter for the transistor within the epitaxial silicon.

\* \* \* \* \*